(12) United States Patent
Jeon et al.

(10) Patent No.: US 8,476,634 B2
(45) Date of Patent: Jul. 2, 2013

(54) DISPLAY DEVICE AND METHOD OF MANUFACTURING THE SAME

(75) Inventors: Hyung-Il Jeon, Incheon (KR); Dae-Jin Park, Incheon (KR); Tae-Hyung Hwang, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 214 days.

(21) Appl. No.: 12/907,537

(22) Filed: Oct. 19, 2010

(65) Prior Publication Data

US 2011/0147747 A1 Jun. 23, 2011

(30) Foreign Application Priority Data

Dec. 21, 2009 (KR) .................. 10-2009-0127648

(51) Int. Cl.
*H01L 29/04* (2006.01)
*H01L 29/10* (2006.01)
*H01L 31/00* (2006.01)

(52) U.S. Cl.
USPC 257/59; 257/72; 257/E33.053; 257/E33.059; 438/30

(58) Field of Classification Search
USPC ................ 257/E51.005, E51.006, E33.053, 257/E33.058
See application file for complete search history.

(56) References Cited

U.S. PATENT DOCUMENTS

| 7,566,950 | B2 | 7/2009 | Huang et al. | |
|---|---|---|---|---|
| 2002/0015806 | A1* | 2/2002 | Kim | 428/1.1 |
| 2003/0027369 | A1* | 2/2003 | Yamazaki | 438/21 |
| 2005/0023525 | A1* | 2/2005 | Ishikawa | 257/59 |
| 2007/0181246 | A1* | 8/2007 | Yamashita et al. | 156/235 |
| 2008/0185588 | A1* | 8/2008 | Park et al. | 257/59 |
| 2008/0212000 | A1 | 9/2008 | French et al. | |
| 2009/0128760 | A1* | 5/2009 | Liu et al. | 349/122 |

FOREIGN PATENT DOCUMENTS

| JP | 2004-140267 | 5/2004 |
|---|---|---|
| JP | 2008-134594 | 6/2008 |
| JP | 2008-159934 | 7/2008 |
| JP | 2009-199006 | 9/2009 |
| KR | 1020020032951 | 5/2002 |
| KR | 1020070047114 | 5/2007 |
| KR | 1020080020024 | 3/2008 |
| KR | 1020080039629 | 5/2008 |
| KR | 1020090086337 | 8/2009 |

OTHER PUBLICATIONS

English Abstract for Publication No. 1020020032951.
English Abstract for Publication No. 2004-140267.

(Continued)

*Primary Examiner* — Michelle Mandala
*Assistant Examiner* — Shaka White
(74) *Attorney, Agent, or Firm* — F. Chau & Associates, LLC

(57) ABSTRACT

A display device includes a flexible panel and a cover member. The flexible panel includes a first substrate and a second substrate. The first substrate includes a first support layer in which an organic insulation layer and an inorganic insulation layer are stacked thereon, and a thin-film transistor and a pixel electrode disposed on the first support layer. The second substrate is opposite to the first substrate. The second substrate includes an organic insulation layer and a second support layer on which the inorganic insulation layer is deposited. The cover member covers an outer surface of the flexible panel. Thus, a display device is manufactured by using a support layer on which an organic insulation layer and an inorganic insulation layer are coated as a base substrate, so that defects generated in a manufacturing process may be prevented.

28 Claims, 11 Drawing Sheets

OTHER PUBLICATIONS

English Abstract for Publication No. 1020080020024.
English Abstract for Publication No. 1020080039629.
English Abstract for Publication No. 2008-134594.
English Abstract for Publication No. 2008-159934.
English Abstract for Publication No. 1020090086337.
English Abstract for Publication No. 2009-199006.
English Abstract for Publication No. 1020070047114.

* cited by examiner

DISPLAY DEVICE AND METHOD OF MANUFACTURING THE SAME

CROSS-REFERENCE TO RELATED APPLICATIONS

This application claims priority under 35 U.S.C. §119 to Korean Patent Application No. 10-2009-0127648, filed on Dec. 21, 2009 in the Korean Intellectual Property Office (KIPO), the contents of which are herein incorporated by reference in their entirety.

BACKGROUND OF THE INVENTION

1. Technical Field

Exemplary embodiments of the present invention relate to a display device. More particularly, exemplary embodiments of the present invention relate to a display device and a method of manufacturing the display device.

2. Discussion of the Related Art

Generally, flat panel display devices include a liquid crystal display ("LCD") device. The LCD includes an LCD panel and a backlight assembly providing lights to the LCD panel. The LCD panel includes an array substrate on which a plurality of thin-film transistors ("TFTs") is arranged, a color filter substrate on which a color filter is arranged, and a liquid crystal layer interposed between the array substrate and the color filter substrate.

As the TFT is manufactured at high temperature, a glass substrate having heat resistance and low thermal expansion coefficient is used as a base substrate of the LCD panel. In addition, the glass substrate is inexpensive. However, the glass substrate is easy to break and is difficult to produce thinly; accordingly, the use of a glass substrate is becoming an obstacle to producing a thin and lightweight. LCD panel In order to solve the obstacle, a plastic LCD device has been recently developed in which a glass substrate used as a base substrate of the LCD device is substituted with a plastic substrate. As the plastic LCD device employs a plastic film having a thickness of about 0.6 mm less than that of a glass substrate employed in a conventional LCD device, the plastic LCD device is lightweight and is more flexible so that the plastic LCD device is not easily broken. In addition, manufacturing costs of the plastic LCD device may be reduced in comparison with a conventional LCD device.

In a method of manufacturing the plastic LCD device, the plastic film is laminated on a carrier substrate, a TFT process is completed, and then the plastic film is stripped from the carrier substrate.

The method of manufacturing the plastic LCD device may use a plastic film having superior heat resistance, mechanical strength and chemical stability. However, there is currently no plastic film with satisfactory characteristics for TFT, color filter, liquid crystals and module processes. One problem is that a thicker plastic film, which does not have a stable volume when subjected to environment variations such as heat, moisture, chemical impact, etc., is used as a base substrate of the LCD device. Thus, misalignment between layers, bending of the carrier substrate by thermal expansion coefficient, and various defects may be generated due to volume variations of the plastic film.

SUMMARY OF THE INVENTION

Exemplary embodiments of the present invention provide a display device having flexibility for enhancing reliability thereof.

Exemplary embodiments of the present invention also provide a method of manufacturing the above-mentioned display device.

According to one aspect of the present invention, a display device includes a flexible panel and a cover member. The flexible panel includes a first substrate and a second substrate. The first substrate includes a first support layer in which an organic insulation layer and an inorganic insulation layer are stacked thereon, and a thin-film transistor and a pixel electrode disposed on the first support layer. The second substrate is opposite to the first substrate. The second substrate includes an organic insulation layer and a second support layer on which the inorganic insulation layer is deposited. The cover member covers an outer surface of the flexible panel.

According to another aspect of the present invention, there is provided a method of manufacturing a display device. In the method, a panel structure including a first display cell and a second display cell is formed. The first display cell includes a first carrier substrate; a first attaching layer disposed on the first carrier substrate; a first support layer disposed on the first attaching layer comprising an organic insulation layer and an inorganic insulation layer that are stacked on the first attaching layer; and a thin-film transistor and a pixel electrode disposed on the first support layer. The second display cell includes a second carrier substrate opposite to the display cell; a second attaching layer disposed on the second carrier substrate; and a second support layer disposed on the second attaching layer comprising an organic insulation layer and an organic insulation that are stacked thereon. Then, a flexible printed circuit board is electrically attached on an end portion of the panel structure. Then, a cover member is formed to cover an outer surface of a flexible panel in which the first and second carrier substrates are separated from each other.

According to an exemplary embodiment of the present invention, a display device is manufactured using a support layer on which an organic insulation layer and an inorganic insulation layer are coated as a base substrate, so that defects generated in a manufacturing process may be prevented.

BRIEF DESCRIPTION OF THE DRAWINGS

The above and other features and aspects of exemplary embodiments of the present invention will be with reference to the accompanying drawings, in which.

DETAILED DESCRIPTION OF THE EXEMPLARY EMBODIMENTS

Figure 1:
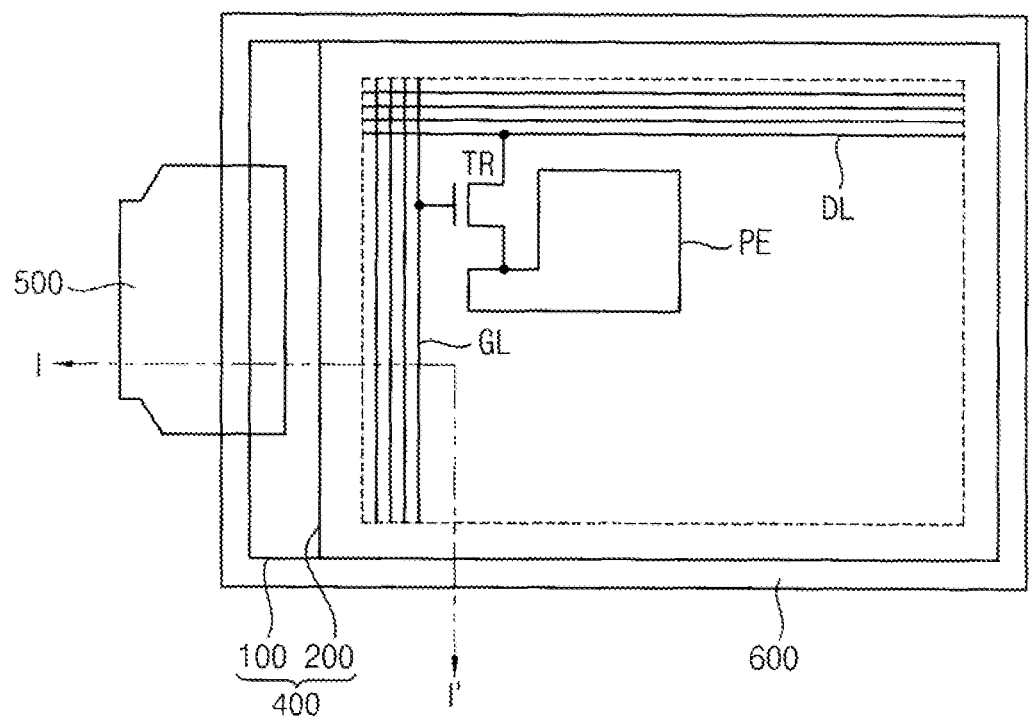
FIG. 1 is a plan view illustrating a display device according to an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

It will be understood that, although the terms first, second, third etc. may be used herein to describe various elements, components, regions, layers and/or sections, these elements, components, regions, layers and/or sections should not be limited by these terms. These terms may only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features may then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" may be intended to include the plural forms as well.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes might not be intended to illustrate the actual shape of a region of a device and are not intended to limit the scope of the present invention.

Hereinafter, exemplary embodiments of the present invention will be explained in detail with reference to the accompanying drawings.

FIG. 1 is a plan view illustrating a display device according to an exemplary embodiment of the present invention.

Referring to FIG. 1, the display device includes a flexible panel 400, a flexible printed circuit board (FPCB) 500 and a cover member 600. The flexible panel 400 includes a first flexible substrate 100 and a second flexible substrate 200.

The first flexible substrate 100 includes a first support layer 110 (FIG. 2) and a pixel layer formed on the first support layer 110. The first support layer 110 may have flexibility. The pixel layer may include a gate line GL extending in a first direction, a data line DL extending in a second direction crossing the first direction, a thin-film transistor ("TFT") TR connected to the gate line GL and the data line DL and a pixel electrode PE connected to the TFT TR. Moreover, the pixel layer may further include a color filter disposed between the pixel electrode PE and the first support layer 110.

The second flexible substrate 200 includes a second support layer 210 (FIG. 2) facing the first support layer 110. The second support layer 210 may have flexibility. The second flexible substrate 200 may include a common electrode corresponding to the pixel layer of the first flexible substrate 100. Alternatively, the second flexible substrate 200 may include a common electrode and a color filter corresponding to the pixel layer. When a color filter is not formed on the pixel layer, a color filter and a common electrode are disposed on the second support layer 210. When a color filter is formed on the pixel layer, a common electrode is disposed on the second support layer 210. Moreover, when the pixel layer includes a first pixel electrode and a second pixel layer which form a horizontal electric field, a common electrode need not be disposed on the second support layer 210.

Although not shown in FIG. 1, when the display device is a liquid crystal display (LCD) device, a liquid crystal layer is disposed between the first flexible substrate 100 and the second flexible substrate 200. Alternatively, when the display device is an electrophoretic display (EPD) device, an electrophoretic layer may be disposed between the first flexible substrate 100 and the second flexible substrate 200.

Figure 2:
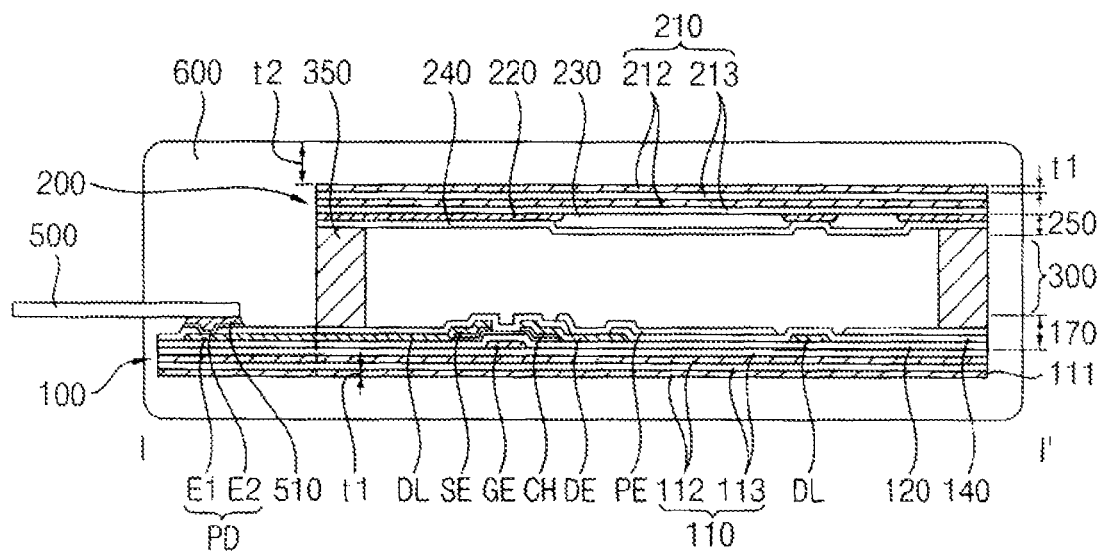
FIG. 2 is a cross-sectional view taken along a line I-I' of FIG. 1.

The FPCB 500 is electrically connected to an end portion of the first flexible substrate 100, which is exposed by the second flexible substrate 200, using a conductive adhesive 510 (FIG. 2). The flexible printed circuit board 500 provides the first and second flexible substrates 100 and 200 with an electric signal.

The cover member 600 covers an outer surface of the flexible panel 400 on which the FPCB 500 is attached and supports the flexible panel 400. The cover member 600 may have flexibility.

FIG. 2 is a cross-sectional view taken along a line I-I' of FIG. 1.

Referring to FIGS. 1 and 2, the flexible panel 400 includes the first flexible substrate 100, the second flexible substrate 200 and a liquid crystal layer 300 interposed therebetween.

The first flexible substrate 100 includes the first support layer 110 and a pixel layer 170. The first support layer 110 may have flexibility. The first support layer 110 includes an organic insulation layer 112 and an inorganic insulation layer 113 formed on the organic insulation layer 112. The inorganic insulation layer 113 may function as a barrier which protects the pixel layer 170 from polluting materials such as moisture, gas, etc., that are generated from the organic insulation layer 112 in a processing environment of the first flexible substrate 100. The organic insulation layer 112 and the inorganic insulation layer 113 may be repeatedly stacked thereon. The number of times the organic insulation layer 112 and the inorganic insulation layer 113 are stacked may be set in accordance with a condition of manufacturing process and needs of a manufacturer.

The organic insulation layer 112 may include one or more of a polyimide (PI) resin, a polyethersulfone (PES) resin, a polyethyleneterephthalate (PET) resin, a polyarylate (PAR) resin, an acrylite resin and so on. A first thickness 't1' of the organic insulation layer 112 may be about 3 µm to about 25 µm.

The thickness of the organic insulation layer 112 may be in a range between a thickness capable of supporting the pixel layer 170 before the cover member 600 is formed after a carrier substrate is attached thereto and a thickness at which a manufacturing process of the pixel layer 170 is easily performed. The organic insulation layer 112 might not be suitable for a function of a support layer when the thickness of the organic insulation layer 112 is smaller than about 3 µm, and defects may be generated for a manufacturing process of the pixel layer 170 when the thickness of the organic insulation layer 112 is greater than about 25 µm. In this case, the defects may be generated due to a temperature factor or a moisture factor, a thin-film stress, etc. Thus, the thickness of the organic insulation layer 112 may be about 3 µm to about 25 µm.

The inorganic insulation layer 113 may include one or more of a silicon nitride (SiNx), a silicon oxide (SiOx) or a silicon oxide nitride (SiOxNy), although other suitable insulation layers would also be within the scope of these embodiments. The thickness of the inorganic insulation layer 113 may be varied in accordance with a processing condition to perform a barrier function.

The TFT TR is disposed to contact with an inorganic insulation layer 113 of the first support layer 110. The inorganic insulation layer 113 corresponding to an uppermost surface of the first support layer 110 contacts with the TFT TR.

The pixel layer 170 is disposed on the first support layer 110.

For example, the pixel layer 170 includes a TFT TR connected to the gate line GL and the data line DL, a protection insulation layer 140 disposed on the first support layer 110 to cover the TFT TR, and a pixel electrode PE connected to the TFT TR through a contact hole formed through the protection insulation layer 140. The TFT TR includes a gate electrode GE connected to the gate line GL (not shown), a source electrode SE connected to the data line DL, a drain electrode DE spaced apart from the source electrode SE, and a channel pattern CH below the source electrode SE and the drain electrode DE. The pixel layer 170 includes a gate insulation layer 120 disposed on the first support layer 110 to cover the gate line GL and the gate electrode GE. The pixel layer 170 includes a pad portion PD formed at a first side of the data line DL. The pad portion PD includes an end portion E1 of the data line DL and a pad electrode E2 connected to the end portion E1 through a contact hole.

Although not shown in FIGS. 1 and 2, the pixel layer 170 may further include a color filter disposed between the gate insulation layer 120 and the pixel electrode PE and a light-blocking pattern disposed to cover an area in which the pixel electrode PE is not formed to block lights.

The second flexible substrate 200 includes the second support layer 210 and an electrode layer 250 disposed on the second support layer 210. The second support layer 210 may have flexibility. The second support layer 210 includes an organic insulation layer 212 and an inorganic insulation layer 213 disposed on the organic insulation layer 212. The inorganic insulation layer 213 may function as a barrier which protects the electrode layer 250 from polluting materials such as moisture, gas and so on that are generated from the organic insulation layer 212 in a processing environment of the first flexible substrate 100. The organic insulation layer 212 and the inorganic insulation layer 213 may be repeatedly stacked. The number of times the organic insulation layer 212 and the inorganic insulation layer 213 are stacked may be set in accordance with a condition of manufacturing process and needs of a manufacturer.

The organic insulation layer 212 may include one or more of a polyimide (PI) resin, a polyethersulfone (PES) resin, a polyethyleneterephthalate (PET) resin, a polyarylate (PAR) resin, an acrylite resin and so on. A first thickness 't1' of the organic insulation layer 212 may be about 3 µm to about 25 µm.

The thickness of the organic insulation layer 112 may be in a range between a thickness capable of supporting the pixel layer 170 before the cover member 600 is formed after a carrier substrate is attached thereto and a thickness at which a manufacturing process of the pixel layer 170 is easily performed. The organic insulation layer 112 may not be suitable for a function of a support layer when the thickness of the organic insulation layer 112 is smaller than about 3 µm, and defects may be generated for a manufacturing process of the pixel layer 170 when the thickness of the organic insulation layer 112 is greater than about 25 µm. In this case, the defects may be generated due to a temperature factor or a moisture factor, a thin-film stress, etc. Thus, the thickness of the organic insulation layer 112 may be about 3 µm to about 25 µm.

The inorganic insulation layer 213 may include one or more of a silicon nitride (SiNx), a silicon oxide (SiOx) or a silicon oxide nitride (SiOxNy), although other suitable insulation layers would also be within the scope of these embodiments. The thickness of the inorganic insulation layer 213 may be varied in accordance with a processing condition to perform a barrier function.

The electrode layer 250 includes a common electrode 240 opposite to the pixel electrode PE of the first flexible substrate 100. For example, the electrode layer 250 includes a light-blocking pattern 220 disposed on the second support layer 210, a color filter 230 and the common electrode 240. The light-blocking pattern 220 is disposed on the second support layer 210 and covers an area in which the pixel electrode PE is not formed, and the light-blocking pattern 220 blocks light. The color filter 230 is disposed on the second support layer 210 in correspondence with an area in which the pixel electrode PE is formed, and the color filter 230 converts light transmitted through the pixel electrode PE into colored light. The common electrode 240 is disposed on the color filter 230. The common electrode 240 and the pixel electrode PE form an electric field.

Although not shown in FIGS. 1 and 2, when the first flexible substrate 100 includes the light-blocking pattern 220 and the color filter 230, the light-blocking pattern 220 and the color filter 230 may be omitted from the second flexible substrate 200. Moreover, when the flexible panel 400 is driven in a horizontal electric field mode, the common electrode 240 may be omitted from the second flexible substrate 200.

The liquid crystal layer 300 is disposed between the first flexible substrate 100 and the second flexible substrate 200, and then the liquid crystal layer 300 is sealed by a sealant 350.

The liquid crystal layer 300 may be disposed between the first flexible substrate 100 and the second flexible substrate 200 in the case of an LCD device. Alternatively, the above technical feature may be employed in an EPD device.

A first edge portion of the FPCB 500 is electrically connected to the pad portion PD (not shown) formed on the first flexible substrate 100 through a conductive adhesive 510. A second edge portion of the FPCB 500 is electrically connected to an external device (not shown). The FPCB 500 delivers an electric signal received from the external device to the flexible panel 400.

The cover member 600 is disposed to cover edge surfaces of the flexible panel 400 in which the FPCB 500 is attached. A second thickness t2 of the cover member 600 may be about 20 μm to about 300 μm.

A thickness of the cover member 600 may be set in accordance with a thickness of a display device and an amount of handling that the display device endures during an assembling process. When the thickness of the cover member 600 is less than about 20 μm, assembling the display device may be difficult. When the thickness of the cover member 600 is more than about 300 μm, stability of the display device is good. However, the entire thickness of the display device may be thicker than a display device employing a conventional glass substrate. Thus, the thickness of the cover member 600 may be greater than or equal to about 20 μm and less than or equal to about 300 μm.

The cover member 600 covers the flexible panel 400 to support the flexible panel 400. Moreover, the cover member 600 covers a portion in which the first flexible substrate 100 and the FPCB 500 are adhered to each other. Accordingly, an adhesive force of the FPCB 500 may be increased.

FIGS. 3A, 3B, 3C, 3D and 3D are process diagrams showing a method of manufacturing the first flexible substrate of FIG. 2 according to an exemplary embodiment of the present invention.

Figure 3A:
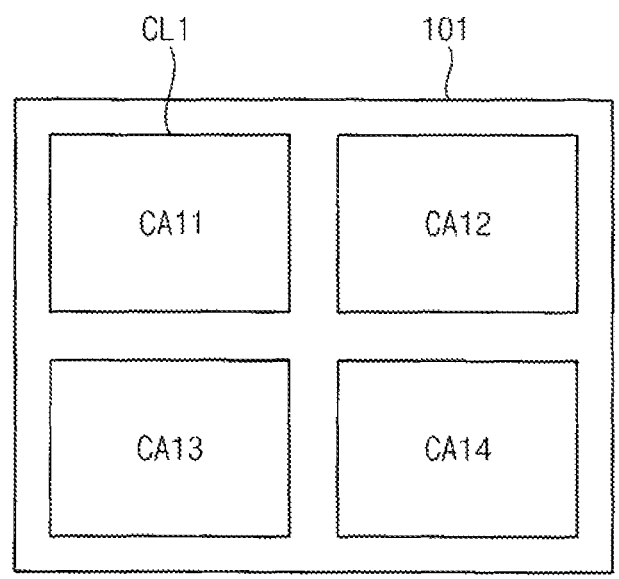
FIGS. 3A, 3B, 3C and 3D are process diagrams showing a method of manufacturing the first flexible substrate of FIG. 2.

FIG. 3A is a plan view of a first carrier substrate 101 for manufacturing a first flexible substrate.

Referring to FIGS. 2 and 3A, the first carrier substrate 101 may be a rigid type material that is suitable to a high temperature process. For example, the first carrier substrate 101, may include a glass substrate. A first cutting line CL1 is formed on the first carrier substrate 101, which defines a plurality of display cell areas CA11, CA12, CA13 and CA 14. When the following process is performed, the first flexible substrate 100 is formed on the first display cell areas CA11, CA12, CA13 and CA14, respectively.

Figure 3B:
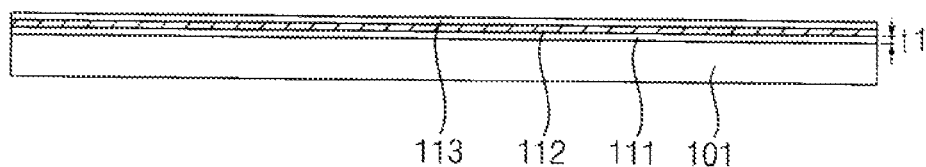
Figure 3C:
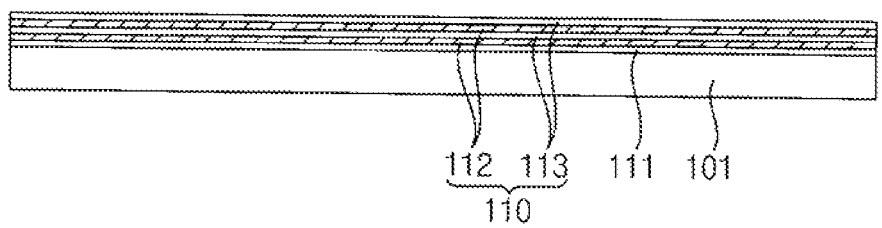

FIGS. 3B and 3C are process diagrams explaining a manufacturing method for forming the first flexible substrate 100 on the first carrier substrate 101.

Referring to FIGS. 2, 3A and 3B, a first attaching layer 111 is formed on the first carrier substrate 101. The first attaching layer 111 may include an inorganic insulation material. The inorganic insulation material may include one or more of a silicon nitride (SiNx), a silicon oxide (SiOx) or a silicon oxide nitride (SiOxNy), although other suitable insulation layers would also be within the scope of these embodiments. The first attaching layer 111 is a sacrificial layer that is removed when the first flexible substrate 100 is separated from the first carrier substrate 101. Laser light may be used to remove the sacrificial first attachment layer 111.

An organic insulation material is coated on the first carrier substrate 101 in which the first attaching layer 111 is formed so as to form an organic insulation layer 112. A first thickness 't1' of the organic insulation layer 112 may be about 3 μm to about 25 μm. The organic insulation layer 112 may include one or more of a polyimide (PI) resin, a polyethersulfone (PES) resin, a polyethyleneterephthalate (PET) resin, a polyarylate (PAR) resin, an acrylite resin and so on.

An inorganic insulation material is coated on the first carrier substrate 101 in which the organic, insulation layer 112 is formed to form an inorganic insulation layer 113. The inorganic insulation layer 113 may include one or more of a silicon nitride (SiNx), a silicon oxide (SiOx) or a siliconoxynitride (SiOxNy), although other suitable inorganic insulation layers would also be within the scope of these embodiments. The organic insulation layer 112 may play a role of a support layer for manufacturing the first flexible substrate 100. The inorganic insulation layer 113 is coated on the organic insulation layer 112, so that the inorganic insulation layer 113 may play a role of blocking polluting materials such as moisture, gas and so on that are generated from the organic insulation layer 112 at a high temperature process.

Referring to FIGS. 2, 3A and 3C, the organic insulation layer 112 and an inorganic insulation layer 113 are repeatedly stacked on the first carrier substrate 101 on which the inorganic insulation layer 113 is formed. The number of times the organic insulation layer 112 and the inorganic insulation layer 113 are stacked may be set in accordance with a condition of manufacturing process and needs of a manufacturer. Then, a first support layer 110 including the inorganic insulation layer 112 and the inorganic insulation layer 113 is formed on the first support layer 110. In this case, an uppermost layer of the first support layer 110 is the inorganic insulation layer 113. The inorganic insulation layer 113 that is the uppermost layer may perform a function of a barrier preventing polluting materials generated at the organic insulation layer 112 from infiltrating into the electrode layer 170.

Figure 3D:
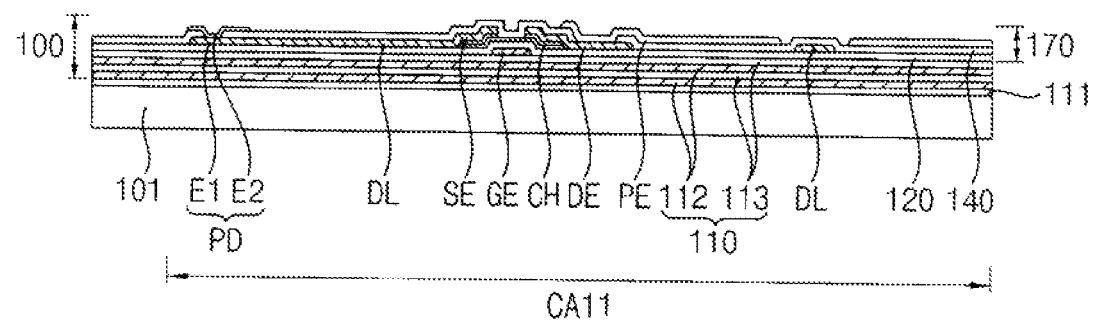

Referring to FIGS. 2, 3A and 3D, the first attaching layer 111 and the first support layer 110 are formed on the first carrier substrate 101, and then the pixel layer 170 is formed.

For example, a first metal material is coated on the inorganic insulation layer 113 of the first support layer 110 to form a first metal layer. The first metal layer is patterned through a photolithography process to form a first metal pattern including the gate line GL (not shown) and the gate electrode GE connected to the gate line GL. The first metal pattern contacts the first inorganic insulation layer 113 of the first support layer 110.

The gate insulation layer 120 is formed on the first support layer 110 on which the first metal pattern is formed. A channel material is coated on the gate insulation layer 120 to form a channel layer. For example, the channel material may include amorphous silicon (a-Si). The channel layer is patterned through a photolithography process to form the channel pattern CH on the gate insulation layer 120 corresponding to the gate electrode GE.

A second metal material is coated on the first support layer 110 on which the channel pattern CH is formed to form a second metal layer. The second metal layer is patterned through a photolithography process to form a second metal pattern including the data line DL, a source electrode SE connected to the data line DL and a drain electrode DE spaced apart from the source electrode SE.

A protection insulation layer 140 is formed on the first support layer 110 on which the second metal pattern is formed, and then the protection insulation layer 140 is patterned to form a contact hole exposing the drain electrode DE and an end portion E1 of the data line DL.

A transparent conductive layer having an optically transparent and electrically conductive material is formed on the first support layer 110 through which the contact hole is formed. The transparent conductive layer is patterned through a photolithography process to form a transparent electrode pattern including the pixel electrode PE and the pad electrode E2.

Accordingly, the first flexible substrate 100 is formed in each of the second display cell areas CA11, CA12, CA13 and CA14 on the first carrier substrate 101.

Figure 4A:
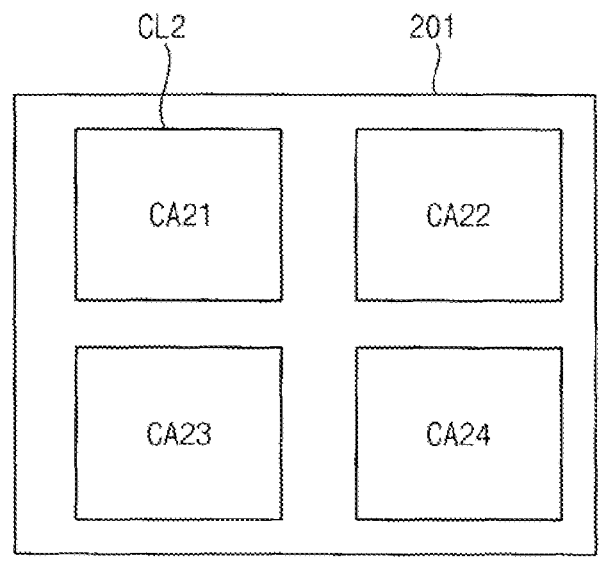
FIGS. 4A, 4B and 4C are process diagrams showing a method of manufacturing the second flexible substrate of FIG. 2.
Figure 4B:
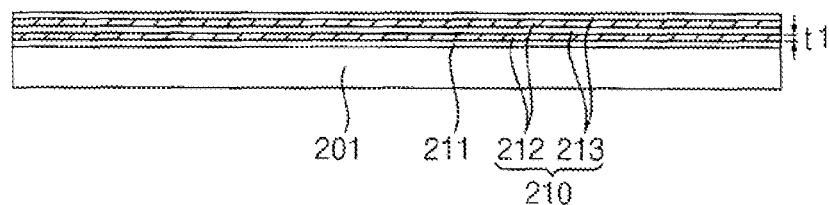
Figure 4C:
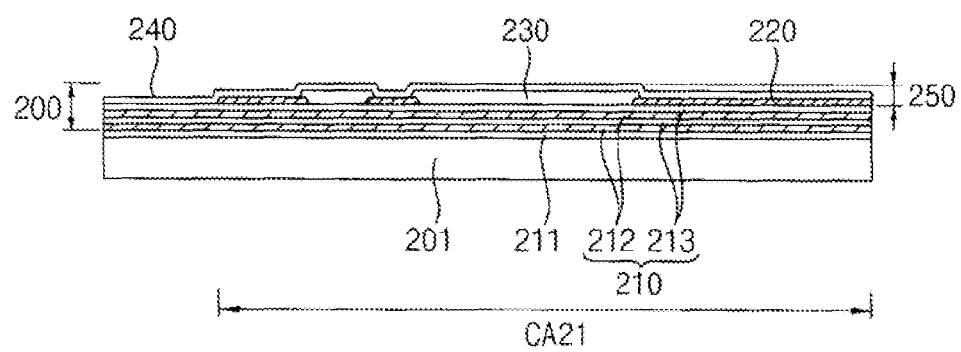

FIGS. 4A, 4B and 4C are process diagrams showing a method of manufacturing the second flexible substrate of FIG. 2;

FIG. 4A is a plan view illustrating a second barrier substrate 201 for manufacturing a second flexible substrate.

Referring to FIGS. 2 and 4A, the second carrier substrate 201 may be a rigid type material that is suitable for a high temperature process. For example, the second carrier substrate 201 may include a glass substrate. A second cutting line CL2 is formed on the second carrier substrate 201, which defines a plurality of second display cell areas CA21, CA22, CA23 and CA24. When the following process is performed, the second flexible substrate 200 is formed on the second display cell areas CA21, CA22, CA23 and CA24, respectively.

FIGS. 4B and 4C are process diagrams illustrating a manufacturing method for forming the second flexible substrate 200 on the second carrier substrate 201.

Referring to FIGS. 2, 4A and 4B, a second attaching layer 211 is formed on the second carrier substrate 201. The second attaching layer 211 may include an inorganic insulation material. The second attaching layer 211 is a sacrificial layer that is removed when the first flexible substrate 200 is separated from the second carrier substrate 201. Laser light may be used to remove the sacrificial second attaching layer.

An organic insulation material is coated on the second carrier substrate 201 in which the second attaching layer 211 is formed to form an organic insulation layer 212. A first thickness 't1' of the organic insulation layer 212 may be about 3 μm to about 25 μm. The organic insulation layer 212 may include one or more of a polyimide (PI) resin, a polyethersulfone (PES) resin, a polyethyleneterephthalate (PET) resin, a polyarylate (PAR) resin, an acrylite resin and so on.

An inorganic insulation material is coated on the second carrier substrate 201 on which the organic insulation layer 212 is formed to form an inorganic insulation layer 213. The inorganic insulation layer 213 may include one or more of a silicon nitride (SiNx), a silicon oxide (SiOx) or a silicon oxide nitride (SiOxNy). The organic insulation layer 212 may perform a function of a support layer during manufacture of the second flexible substrate 200. The inorganic insulation layer 213 is coated on the organic insulation layer 212, so that the inorganic insulation layer 213 may block polluting materials such as moisture, gas, etc., that are generated from the organic insulation layer 212 during a high temperature process.

The organic insulation layer 212 and the inorganic insulation layer 213 may be repeatedly formed on the second carrier substrate 201 in which the inorganic insulation layer 213 is stacked. The number of times the organic insulation layer 212 and the inorganic insulation layer 213 are stacked may be set in accordance with a condition of manufacturing process and needs of a manufacturer. A second support layer 210 including the organic insulation layer 212 and the inorganic insulation layer 213 is formed on the second carrier substrate 201. In this case, an uppermost layer of the second support layer 210 is the inorganic insulation layer 213. The inorganic insulation layer 213 that is the uppermost layer may function as a barrier preventing polluting materials generated at the organic insulation layer 212 from infiltrating into the electrode layer 250.

Referring to FIGS. 2, 4A and 4C, the second attaching layer 211 and the second support layer 210 are formed on the first carrier substrate 201, and then the electrode layer 250 is formed.

For example, a light-blocking layer having a non-transparent material is coated on the inorganic insulation layer 213 of the second support layer 210, and then the light-blocking layer is patterned to form the light-blocking pattern 220. The light-blocking pattern 220 is in contact with the inorganic insulation layer 213 of the second support layer 210 to cover an area in which the pixel electrode PE is not formed, so that a transmitting of light is blocked.

A color photo resist material is formed on the second support layer 210 in which the light-blocking pattern 220 is formed to form the color photo later. The color photo layer is patterned to form the color filter 230 on the second support layer 210. The color filter 230 is in contact with the inorganic insulation layer 213 of the second support layer 210 in correspondence with an area on which the pixel electrode PE is formed, so that lights transmitting the pixel electrode PE are converted into color lights.

An optically transparent and electrically conductive material is coated on the second carrier substrate 201 on which the color filter 230 is formed so as to form the common electrode 240.

Accordingly, the second flexible substrate 200 is formed in each of the second display cell areas CA21, CA22, CA23 and CA24 on the second carrier substrate 201.

FIGS. 5A, 5B, 5C, 5D, 5E and 5F are process diagrams showing a method of manufacturing the display device of FIG. 2 according to an exemplary embodiment of the present invention.

Figure 5A:
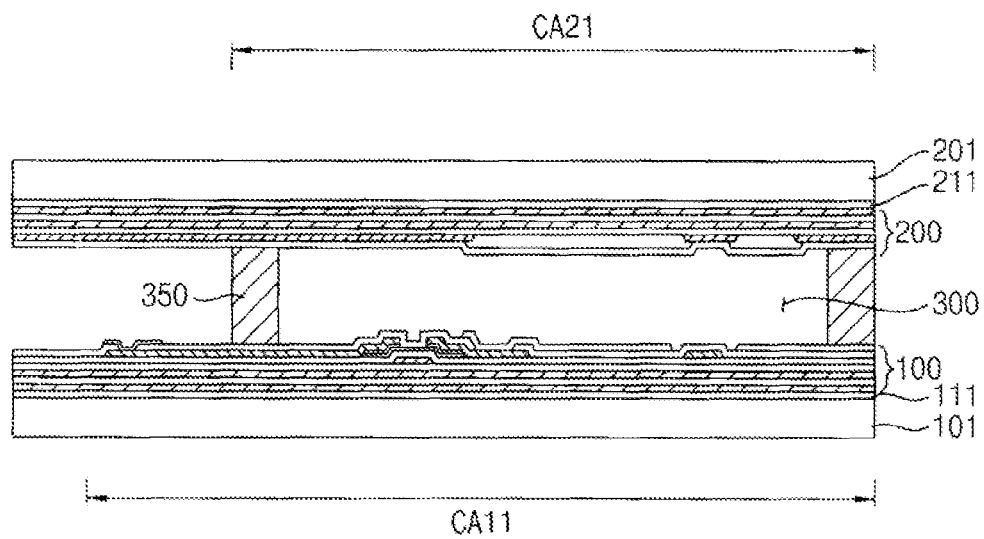
FIGS. 5A, 5B, 5C, 5D, 5E and 5F are process diagrams showing a method of manufacturing the display device of FIG. 2.

Referring to FIGS. 2 and 5A, a coupling process coupling the first carrier substrate 101 having the first flexible substrate 100 formed thereon and the second carrier substrate 201 having the second flexible substrate 200 formed thereon and a liquid crystal injection process forming a liquid crystal layer 300 are performed.

For example, the first carrier substrate 101 and the second carrier substrate 201 are coupled with each other by using the sealant 350, and then liquid crystals are injected therebetween to form the liquid crystal layer 300. Alternatively, liquid crystals are drop-filled into one of the first carrier substrate 101 and the second carrier substrate 201 to form the liquid crystal layer 300, and then the remaining carrier substrate is coupled by using the sealants 350.

Figure 5B:
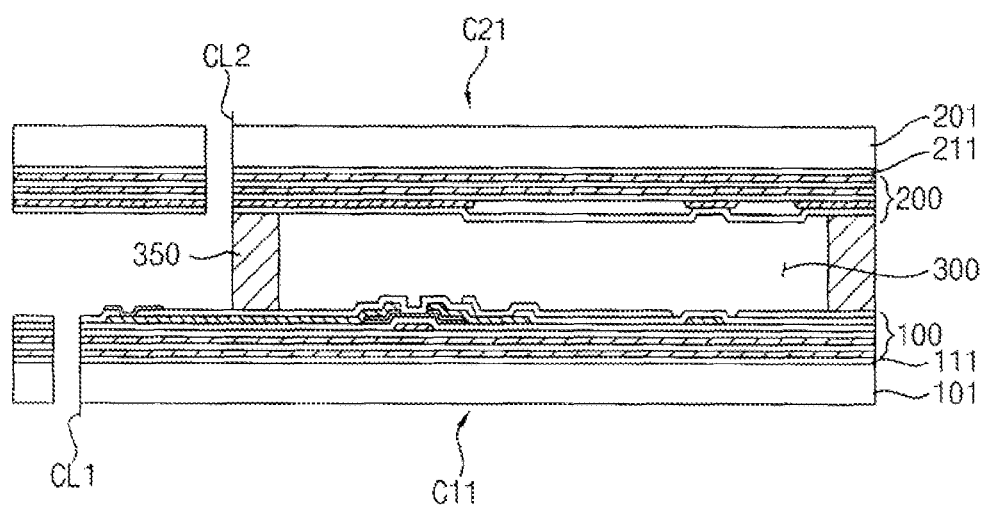

Referring to FIGS. 3A, 4A and 5B, a cutting process is performed along the first cutting line CL1 of the first carrier substrate 101 and the second cutting line CL2 of the second carrier substrate 201.

The first carrier substrate 101 is divided into a plurality of first display cells C11, C12, C13 and C14, and the second carrier substrate 201 is divided into a plurality of display cells C21, C22, C23 and C24. The first carrier substrate 101, the second carrier substrate 201 and the liquid crystal layer 300 are divided into a plurality of panel structures.

Figure 5C:
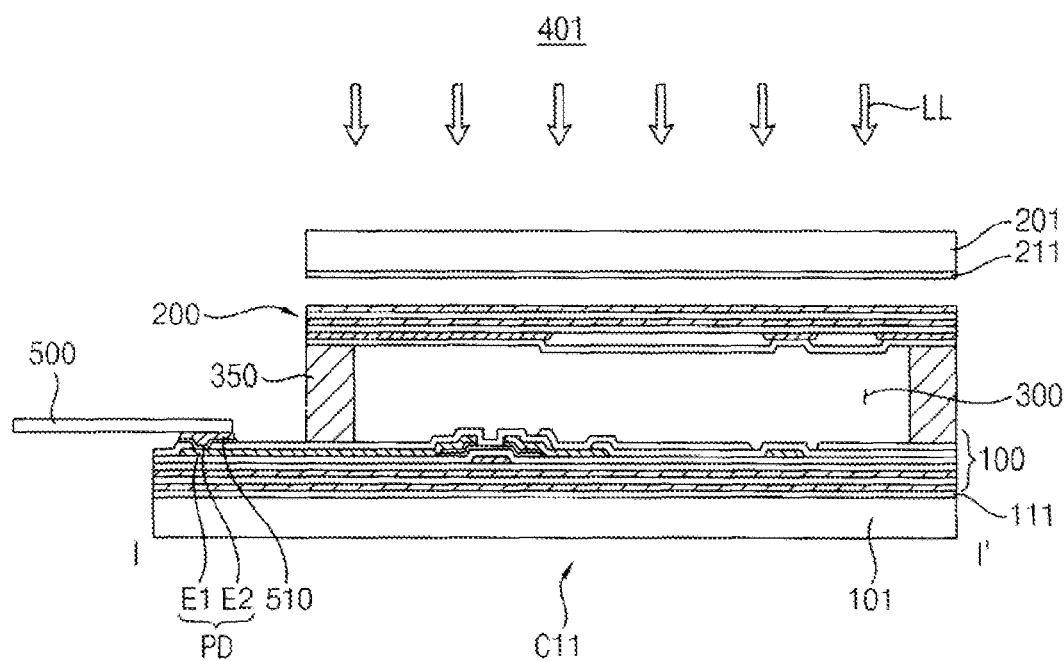

Referring to FIG. 5C, a flexible panel 400 is manufactured by using each of the panel structures in a following process.

An outer lead bonding ("OLB") process is performed, which attaches the FPCB 500 to the panel structure 401. An end portion of the FPCB 500 is attached to the pad portion PD formed at an end portion of the first flexible substrate 100 by using a conductive adhesive 510.

In a status in which the first and second carrier substrates 101 and 201 are separated from the first and second flexible substrates 100 and 200, the OLB process is performed so that a process defect may be prevented. Process defects may otherwise be induced by heat generated in the OLB process. For example, when the OLB process is performed on a flexible substrate in which a carrier substrate is removed, the flexible substrate and the FPCB may be expanded to different extents because the flexible substrate and the FPCB may have different coefficients of thermal expansion (CTE). Accordingly, a pitch between a pad portion of the flexible substrate and a bump portion of the FPCB is not aligned, so that an additional process condition may be required. For example, in order to align the pitches, temperature of the OLB process is decreased or a design of the pitches between the pad portion and the bump portion is adjusted.

Thus, according to the present embodiment, the OLB process is performed before the first and second carrier substrates 101 and 201 are separated from the first and second flexible substrates 100 and 200, so that process reliability and process margin may be enhanced.

After performing the OLB process, a first portion of the panel structure 401 is exposed to a laser light LL, for example, the second display cell C21. The second attaching layer 211 included in the second display cell C21 is transformed and damaged by the laser light LL, so that the second flexible substrate 200 is separated from the second attaching layer 211 of the second carrier substrate 201.

Figure 5D:
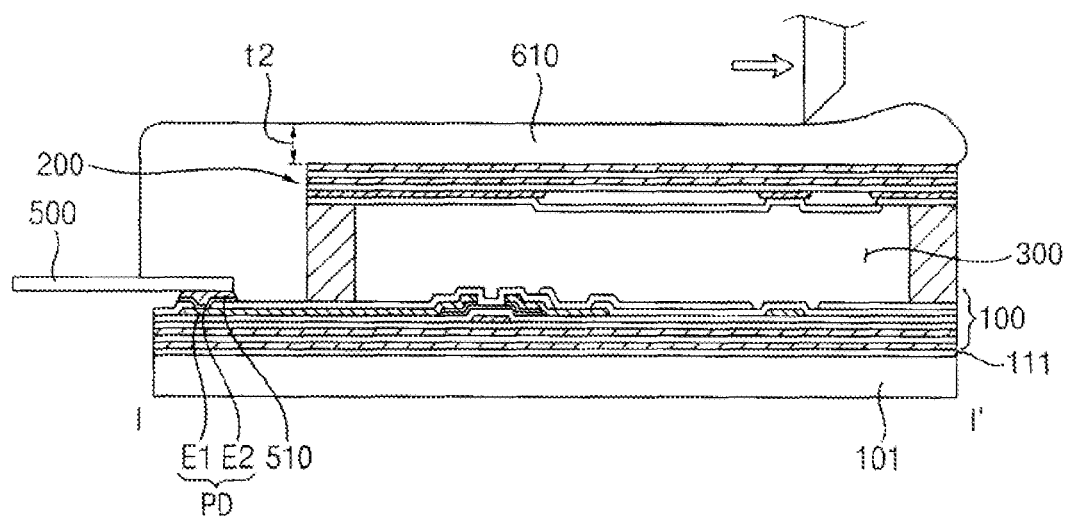

Referring to FIG. 5D, after the second carrier substrate 201 is separated from the second display cell C21, a first flexible cover layer 610 is formed by using a resin material which is curable at a low temperature, to cover an outer surface of the second flexible substrate 200 in which the second carrier substrate 201 is separated therefrom. The resin material may be an optically transparent organic resin material having a CTE of no more than about 20 ppm and a curing temperature of no more than about 300° C. The optically transparent organic resin material may include one or more of a polyimide (PI) resin, a polyethersulfone (PES) resin, a polyethyleneterephthalate (PET) resin, a polyarylate (PAR) resin, an acrylite resin and so on. A second thickness 't2' of the first flexible cover layer 610 may be greater than or equal to about 20 μm and less than or equal to about 300 μm.

Figure 5E:
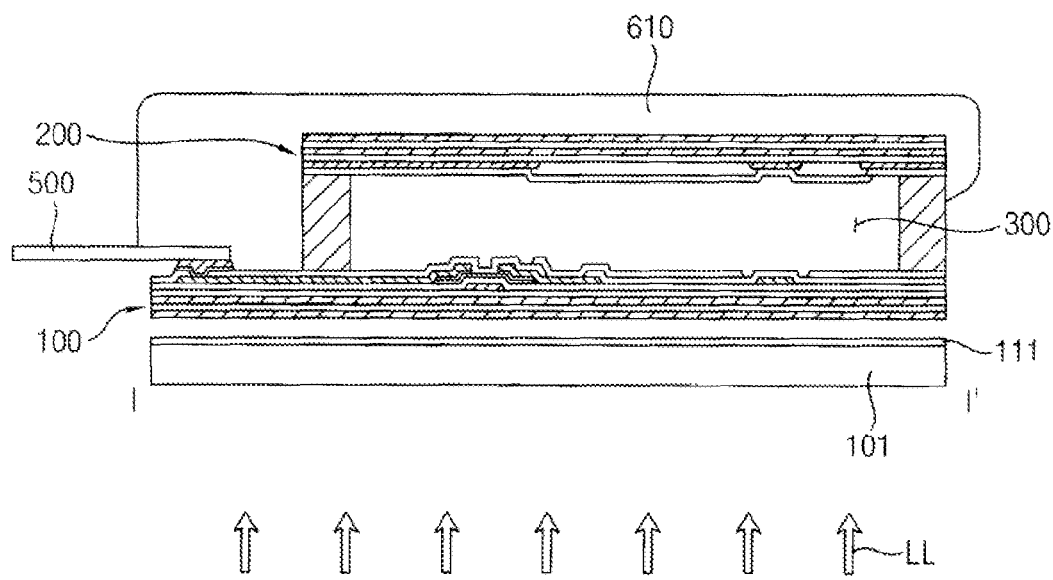

Referring to FIG. 5E, after the first flexible cover layer 610 is formed, a second portion of the panel structure 401 is exposed to a laser light LL, for example, the first display cell C11. The first attaching layer 111 included in the first display cell C11 is transformed and damaged by the laser light LL, so that the first flexible substrate 100 is separated from the first attaching layer 111 of the first carrier substrate 101.

Figure 5F:
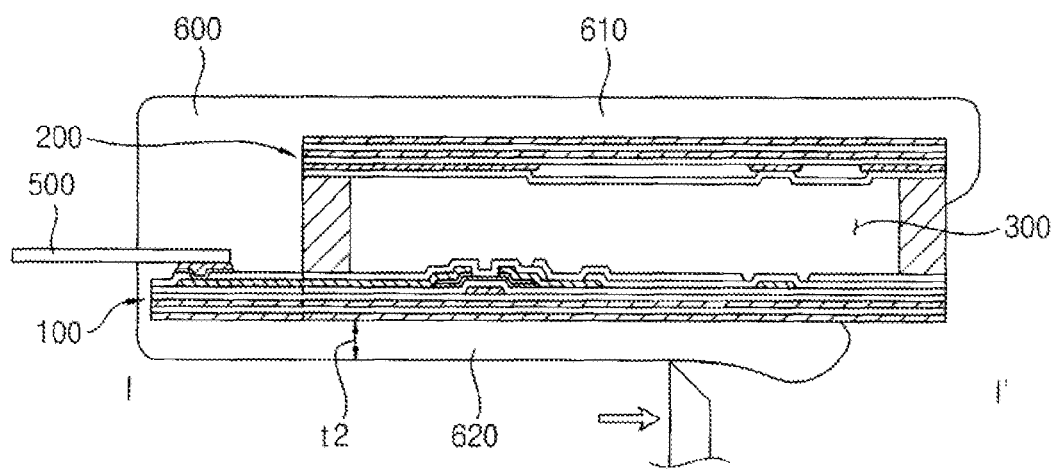

Referring to FIG. 5F, after the first carrier substrate 101 is separated from the first display cell C11, a second flexible cover layer 620 is formed by using the resin material which is curable at a low temperature, to cover an outer surface of the first flexible substrate 100 in which the first carrier substrate 101 is separated therefrom. The second flexible cover layer 620 is formed at an opposite area opposite to the first flexible cover layer 610. A second thickness 't2' of the second flexible cover layer 620 may be greater than or equal to about 20 μm and less than or equal to about 300 μm.

Thus, the flexible panel 400 having the FPCB 500 attached thereon may be covered or supported by the cover member 600 having the first and second flexible cover layers 610 and 620 cured thereon.

It is described above that the second carrier substrate 201 is separated prior to the first carrier substrate 101. Alternatively, the first carrier substrate 101 may be separated prior to the second carrier substrate 201.

Hereinafter, the same reference numerals will be used to refer to the same or like parts as those described above, and any repetitive detailed explanation will be omitted.

Figure 6A:
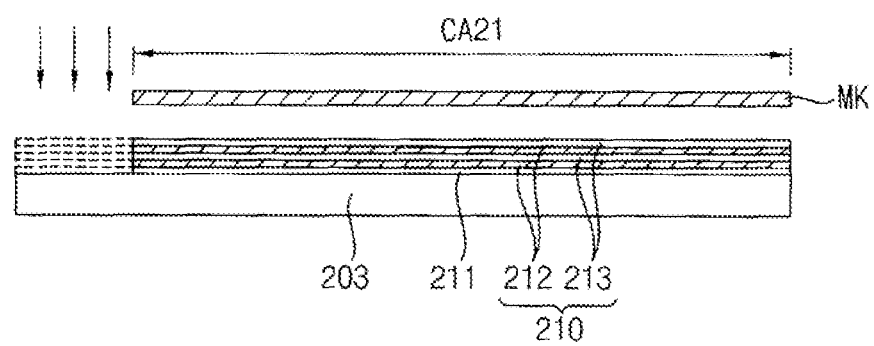
FIGS. 6A and 6B are process diagrams showing a method of manufacturing the display device according to an exemplary embodiment of the present invention.
Figure 6B:
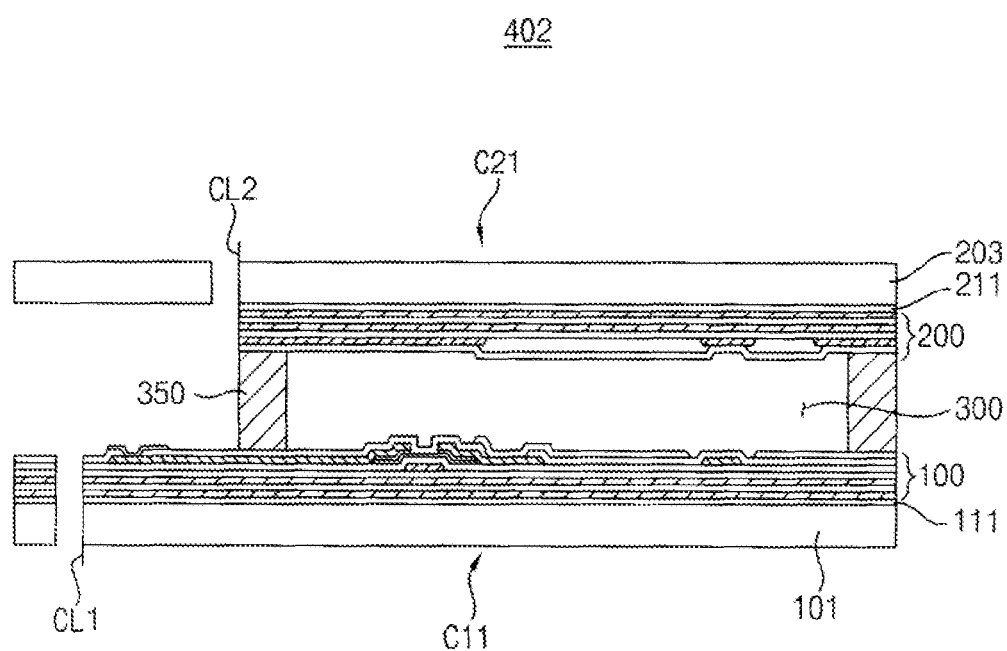

FIGS. 6A and 6B are process diagrams showing a method of manufacturing the display device according to another exemplary embodiment of the present invention.

A method of manufacturing a first flexible substrate 100 according to an exemplary embodiment of the present invention may be substantially the same as described above with reference to FIGS. 3A to 3D. The first flexible substrate 100 is respectively formed on a plurality of the first display cell areas C11, C12, C13 and C14 defined on the first carrier substrate 101.

In manufacturing a second flexible substrate 200, referring to FIGS. 4A and 6A, the second attaching layer 211 is formed on the second carrier substrate 203 on which the second display cell areas C21, C21, C23 and C24 are defined. A second support layer 210 which includes an organic insulation layer 212, an inorganic insulation layer 213, an organic insulation layer 212 and an inorganic insulation layer 213 sequentially deposited thereon, is formed on the second carrier substrate 203 having the second attaching layer 211 attached thereon.

Then, the second carrier substrate 203 is exposed by using a mask MK in which a light-blocking portion is formed in accordance with the second display cell areas CA21, CA22, CA23 and CA24. Thus, the second support layer 210 corresponding to an exposed area by light is removed through an exposing process, so that the second support layer 210 is patterned in correspondence with each of the second display cell areas CA21, CA22, CA23 and CA24. The second support layer 210 that is patterned is formed on the second carrier substrate 203.

Referring to FIG. 6B, a coupling process coupling the first carrier substrate 101 having the first flexible substrate 100 formed thereon and the second carrier substrate 201 having the second flexible substrate 200 formed thereon and a liquid crystal injection process forming a liquid crystal layer 300 are performed. Then, a cutting process is performed to form a plurality of panel structures 402.

An OLB process attaching the FPCB 500 on the panel structure 402, a process of dividing a carrier substrate using a laser light, and a process forming a cover member using a resin material are substantially the same as described above with reference to FIGS. 5A to 5F.

According to an exemplary embodiment of the present invention, the second support layer 210 formed on the second carrier substrate 203 is patterned in correspondence with each of the second display cell areas CA21, CA22, CA23 and CA24 before a cutting process of the first and second carrier substrates 101 and 201 is carried out.

Here, the second support layer 210 is patterned by using an exposure process and a developing process. Alternatively, the second support layer 210 may be patterned by a screen printing process when the second support layer 210 is coated. According to another alternative approach, a solvent included in each of the second support layers 210 may be evaporated, and then the second support layer 210 may be partially removed by using a solvent such as an edge bead removal (EBR) if a bake process is not performed.

Figure 7:
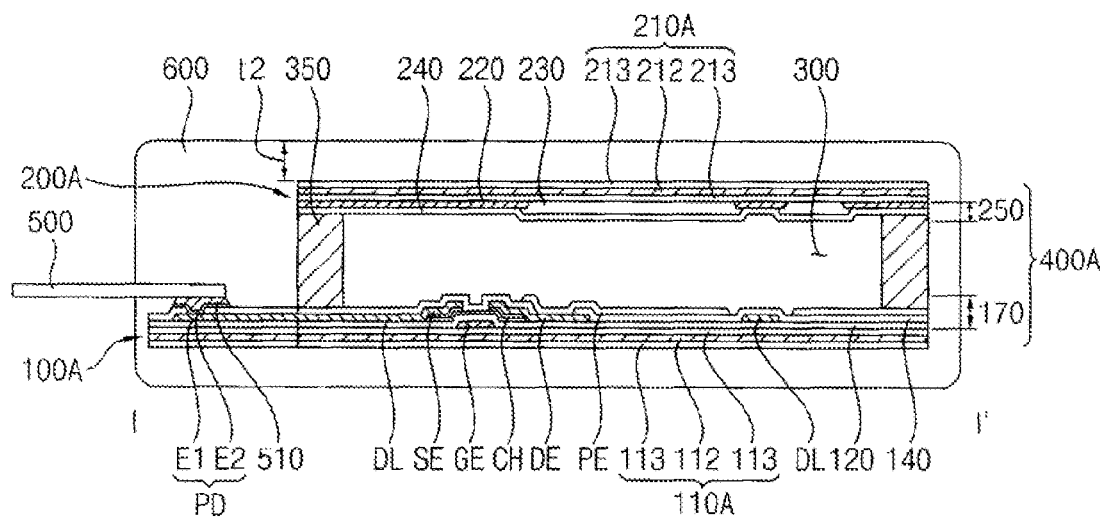
FIG. 7 is a cross-sectional view illustrating a display device according to an exemplary embodiment of the present invention.

FIG. 7 is a cross-sectional view illustrating a display device according to still another exemplary embodiment of the present invention.

Referring to FIGS. 1 and 7, the display device includes a flexible panel 400A, a flexible printed circuit board 500 and a cover member 600. The flexible panel 400A includes a first flexible substrate 100A and a second flexible substrate 200A.

The first flexible substrate 100A includes a first support layer 110A and a pixel layer 170 formed on the first support layer 110A.

The first support layer 110A includes an inorganic insulation layer 113, an organic insulation layer 112 formed on the inorganic insulation layer 113 and an inorganic insulation layer 113 formed on the organic insulation layer 112. The inorganic insulation layer 113 may function as a barrier which protects the pixel layer 170 from a polluting materials such as moisture, gas and so on that are generated from the organic insulation layer 112 in a processing environment of the first flexible substrate 100A. The organic insulation layer 112 and the inorganic insulation layer(s) 113 may be repeatedly stacked thereon. The number of times the organic insulation layer 112 and the inorganic insulation layer(s) 113 are stacked may be set in accordance with a condition of manufacturing process and needs of a manufacturer. The organic insulation layer 112 may include one or more of a polyimide (PI) resin, a polyethersulfone (PES) resin, a polyethyleneterephthalate (PET) resin, a polyarylate (PAR) resin, an acrylite resin and so on. A first thickness 't1' of the organic insulation layer 112 may be greater than or equal to about 3 μm and less than or equal to about 25 μm.

The thickness of the organic insulation layer 112 may be in a range between a thickness capable of supporting the pixel layer 170 before the cover member 600 is formed after a carrier substrate is attached thereto and a thickness at which a manufacturing process of the pixel layer 170 is easily performed. The organic insulation layer 112 might not be suitable for a function of a support layer when the thickness of the organic insulation layer 112 is smaller than about 3 μm, and defects may be generated in a manufacturing process of the pixel layer 170 when the thickness of the organic insulation layer 112 is greater than about 25 μm. In this case, the defects may be generated due to a temperature factor or a moisture factor, a thin-film stress, etc. Thus, the thickness of the organic insulation layer 112 may be greater than or equal to about 3 μm and less than or equal to about 25 μm.

The inorganic insulation layer(s) 113 may include one or more of a silicon nitride (SiNx), a silicon oxide (SiOx) or a silicon oxide nitride (SiOxNy), although other suitable insulation layers would also be within the scope of these embodiments. The thickness of the inorganic insulation layer 113 may be varied in accordance with a processing condition to perform a barrier function.

The pixel layer 170 is disposed on the first support layer 110A.

For example, the pixel layer 170 includes a TFT TR connected to the gate line GL and the data line DL, a protection insulation layer 140 formed on the first support layer 110A to cover the TFT TR, and a pixel electrode PE connected to the TFT TR through a contact hole formed through the protection insulation layer 140. The pixel layer 170 includes a pad portion PD formed at an end portion of the data line DL. The pad portion PD includes an end portion E1 of the data line DL and a pad electrode E2 connected to the end portion E1 through a contact hole.

Although not shown in FIGS. 1 and 7, the pixel layer 170 may further include a color filter disposed between the gate insulation layer 120 and the pixel electrode PE and a light-blocking pattern disposed to cover an area in which the pixel electrode PE is not formed so as to block lights.

The second flexible substrate 200A includes the second support layer 210A and an electrode layer 250 formed on the second support layer 210A as a base substrate of the second support layer 210A. The second support layer 210A includes an inorganic insulation layer 213, an organic insulation layer 212 formed on the inorganic insulation layer 213 and an inorganic insulation 213 formed on the organic insulation layer 212. The inorganic insulation layer(s) 213 may function as a barrier which protects the electrode layer 250 from polluting materials such as moisture, gas, etc., that are generated from the organic insulation layer 212 in accordance with a processing environment of the second flexible substrate 200A. The organic insulation layer 212 and the inorganic insulation layer(s) 213 may repeatedly stacked thereon. The number of times the organic insulation layer 212 and the inorganic insulation layer(s) 213 are stacked may be set in accordance with a condition of manufacturing process and needs of a manufacturer. The organic insulation layer 212 may include one or more of a polyimide (PI) resin, a polyethersulfone (PES) resin, a polyethyleneterephthalate (PET) resin, a polyarylate (PAR) resin, an acrylite resin and so on. A first thickness 't1' of the organic insulation layer 212 may be greater than or equal to about 3 μm and less than or equal to about 25 μm.

The thickness of the organic insulation layer 112 may be in a range between a thickness capable of supporting the pixel layer 170 before the cover member 600 is formed after a carrier substrate is attached thereto and a thickness at which a manufacturing process of the pixel layer 170 is easily performed. The organic insulation layer 112 may not be suitable for a function of a support layer when the thickness of the organic insulation layer 112 is less than about 3 μm, and defects may be generated in a manufacturing process of the pixel layer 170 when the thickness of the organic insulation layer 112 is more than about 170 25 μm. In this case, the defects may be generated due to a temperature factor or a moisture factor, a thin-film stress, etc. Thus, the thickness of the organic insulation layer 112 may be greater than or equal to about 3 μm and less than or equal to about 25 μm.

The inorganic insulation layer 213 may include one or more of a silicon nitride (SiNx), a silicon oxide (SiOx) or a silicon oxide nitride (SiOxNy), although other suitable insulation layers would also be within the scope of these embodiments. The thickness of the inorganic insulation layer 213 may be varied in accordance with a processing condition to perform a barrier function.

The electrode layer 250 includes a common electrode 240 opposite to the pixel electrode PE of the first flexible substrate 100A. For example, the electrode layer 250 includes a light-blocking pattern 220 disposed on the second support layer 210A, a color filter 230 and the common electrode 240.

Although not shown in FIGS. 1 and 7, when the first flexible substrate 100A includes the light-blocking pattern 220 and the color filter 230, the light-blocking pattern 220 and the color filter 230 may be omitted from the second flexible substrate 200A. Moreover, when the flexible panel 400A is operated in a horizontal electric field mode, the common electrode 240 may be omitted from the second flexible substrate 200A.

The liquid crystal layer 300 is disposed between the first flexible substrate 100A and the second flexible substrate 200A to be sealed by a sealant 350.

In this case, an LCD device in which the liquid crystal layer 300 is disposed between the first flexible substrate 100A and the second flexible substrate 200A is explained. Alternatively, the above technical feature may be employed in an EPD device.

A first end portion of the FPC 500 is electrically connected to the pad portion PD in which the first flexible substrate 100A is formed through a conductive adhesive 510.

The cover member 600 is disposed to cover an outer surface of the flexible panel 400A to which the FPCB 500 is attached. The cover member 600 covers the flexible panel 400A to support the flexible panel 400A. A thickness of the cover member 600 may be set in accordance with a thickness of a display device and an amount of handling that the display device endures during an assembling process. When the thickness of the cover member 600 is less than about 20 μm, assembling the display device may be difficult. When the thickness of the cover member 600 is more than about 300 μm, stability of the display device is good. However, the entire thickness of the display device may be thicker than a display device employing a conventional glass substrate. Thus, the thickness of the cover member 600 may be greater than or equal to about 20 μm and less than or equal to about 300 μm.

FIGS. 8A, 8B, 8C, 8D and 8E are process diagrams showing a method of manufacturing the display device of FIG. 7. A method of manufacturing a display device described below may be substantially the same as the method of manufacturing the display device described above however, here, an attaching layer is formed from an organic insulation material.

Figure 8A:
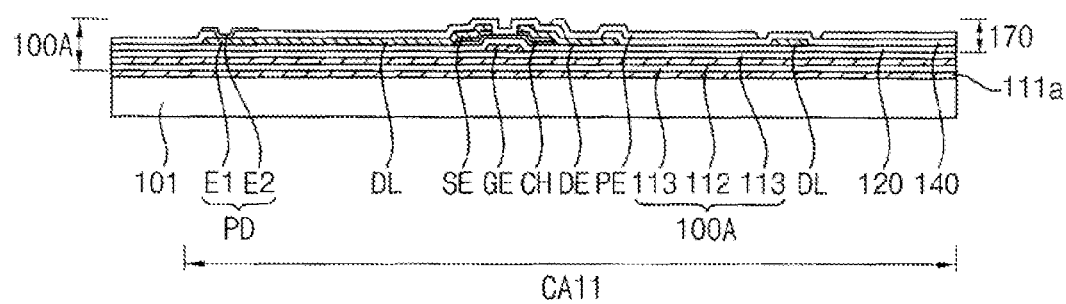
FIGS. 8A, 8B, 8C, 8D and 8E are process diagrams showing a method of manufacturing the display device of FIG. 7.

Referring to FIGS. 3A and 8A, a first attaching layer 111a is formed on the first carrier substrate 101. The first attaching layer 111a may include an organic insulation material. The organic insulation material may include one or more of a polyimide (P1) resin series, an acrylite resin series, etc. The first attaching layer 111a is a sacrificial layer that is removed when the first flexible substrate 100A is separated from the first carrier substrate 101 by using laser light, for example, during the process described below.

An inorganic insulation layer 213, an organic insulation layer 212 and an inorganic insulation layer 213 are sequentially stacked on the first carrier substrate 101 on which the first attaching layer 111a is formed in order to form the first support layer 110A.

The pixel layer 170 is formed on the first support layer 110A formed on the first carrier substrate 101.

Figure 8B:
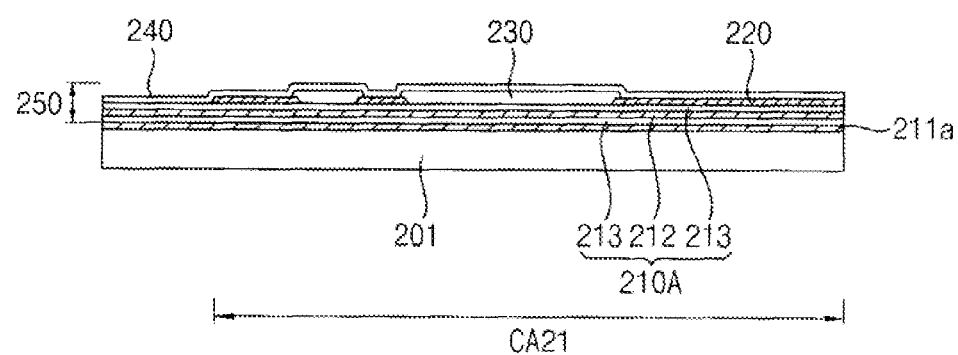

Referring to FIGS. 4A and 8B, a second attaching layer 211a is formed on the second carrier substrate 201. The second attaching layer 211a may include an organic insulation material. The second attaching layer 211a is a sacrificial layer that is removed when the first flexible substrate 200A is separated from the second carrier substrate 201 by using laser light for example, during the process described below.

An inorganic insulation layer 213, an organic insulation layer 212 and an inorganic insulation layer 213 are sequentially stacked on the second carrier substrate 201 in which the second attaching layer 211a is formed to form the second support layer 210A.

The electrode layer 250 is formed on the second support layer 210A formed on the second carrier substrate 201. In this case, the uppermost layer of the first support layer 110A is the inorganic insulation layer 113, and the uppermost layer of the second support layer 210A is the inorganic insulation layer 213.

Figure 8C:
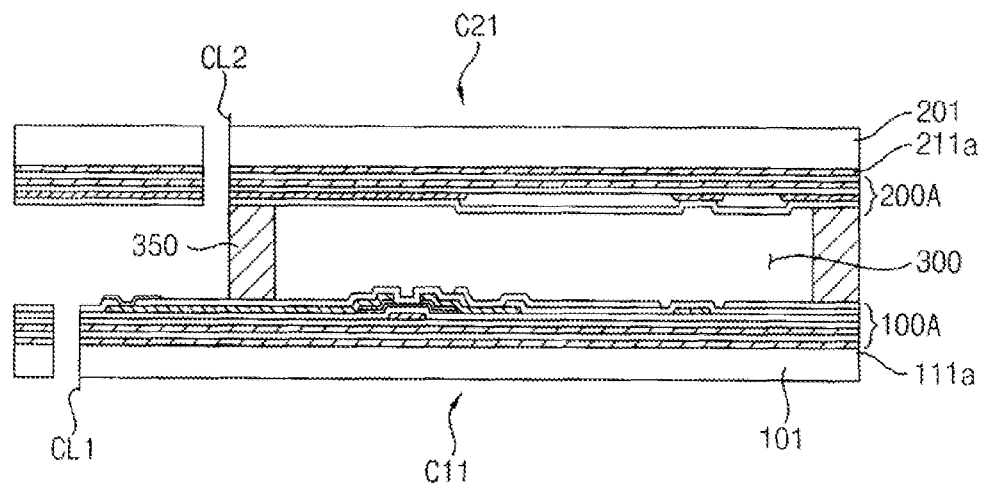

Referring to FIG. 8C, a coupling process coupling the first carrier substrate 101 having the first flexible substrate 100 formed thereon and the second carrier substrate 201 having the second flexible substrate 200 formed thereon and a liquid crystal injection process forming a liquid crystal layer 300 are performed. Then, a cutting process is performed along the first cutting line CL1 of the first carrier substrate 101 and the second cutting line CL2 of the second carrier substrate 201.

The first carrier substrate 101 is divided into a plurality of first display cells C11, C12, C13 and C14, and the second carrier substrate 201 is divided into a plurality of display cells C21, C22, C23 and C24. A plurality of panel structures is manufactured by the cutting process.

Figure 8D:
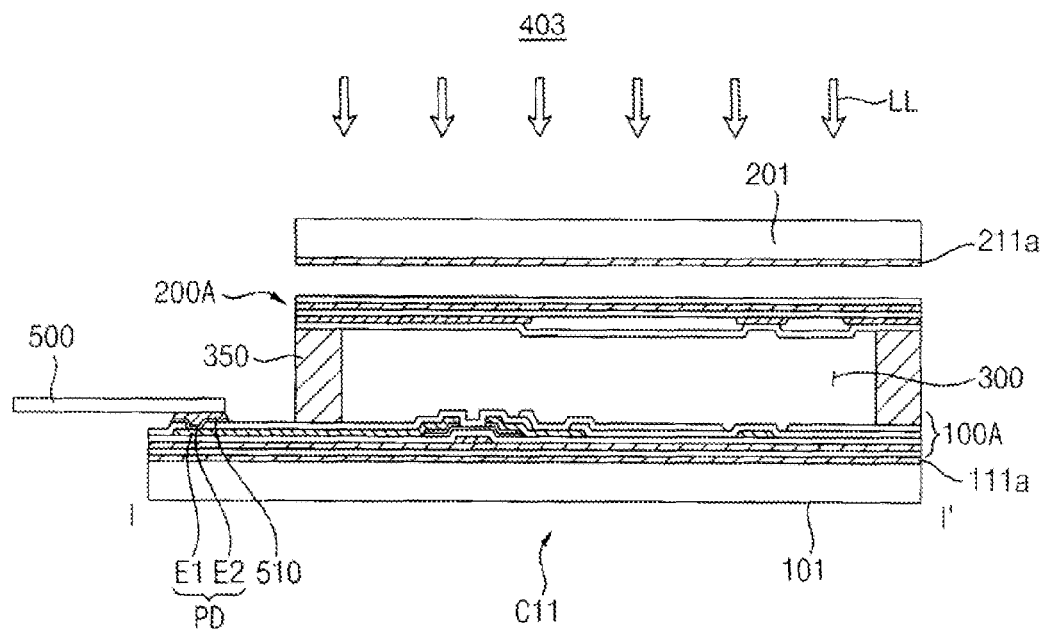

Referring to FIG. 8D, an OLB process is performed, which attaches the FPCB 500 to the panel structure 403. A bump portion formed at an end portion of the FPCB 500 is attached to the pad portion PD formed at an end portion of the first flexible substrate 100A by using a conductive adhesive 510.

After the OLB process, a laser light LL is irradiated onto a first portion of the panel structure 403, for example, the second display cell C21. The second attaching layer 211a included in the second display cell C21 is transformed and damaged by the laser light LL, so that the second flexible substrate 200A is separated from the second carrier substrate 201.

Figure 8E:
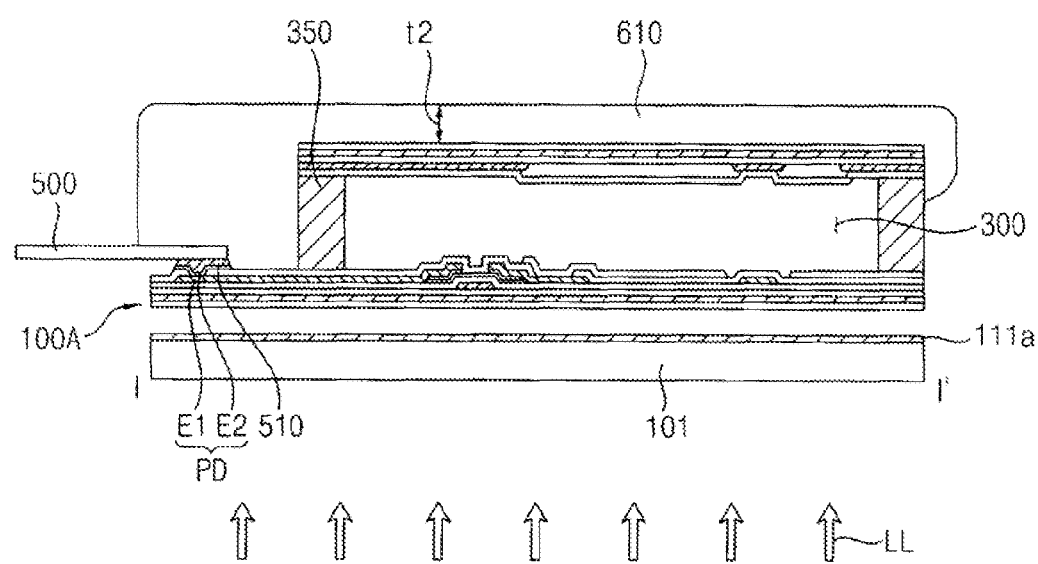

Referring to FIGS. 7 and 8E, after the second carrier substrate 201 is separated from the second display cell C21, a first flexible cover layer 610 is formed by using the resin material which is curable at a low temperature, to cover an outer surface of the second flexible substrate 200A in which the second carrier substrate 201 is separated therefrom.

After the first flexible cover layer 610 is formed, a laser light LL is irradiated onto a second portion of the panel structure 403, for example, the first display cell C11. The first attaching layer 111a included in the first display cell C11 is transformed and damaged by the laser light LL, so that the first flexible substrate 100A is separated from the first carrier substrate 101. Then, a second flexible cover layer which covers an outer surface of the first flexible substrate 100A is formed to the cover member 600 which covers the flexible panel 400A.

The cover member 600 covers a portion in which the first flexible substrate 100A and the FPCB 500 are adhered to each other. Accordingly, an adhesive force of the FPCB 500 may be increased.

According to exemplary embodiments of the present invention, a flexible support layer on which an inorganic insulation layer and an organic insulation are repeatedly stacked on a carrier substrate, and then a TFT, a common electrode, etc., are formed on the flexible support layer to manufacture a flexible substrate. The flexible support layer may be manufactured thinly rather than a plastic substrate in which a film is laminated on a conventional carrier substrate, and a high temperature process is performed on the thin flexible support layer so that process reliability may be enhanced.

Moreover, an OLB process is performed before the carrier substrate is removed, so that process margin may be enhanced.

Furthermore, a flexible cover member covers an outer surface of a flexible panel manufactured by using the flexible support layer, so that the thin flexible panel may be stably supported.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention.

What is claimed is:

1. A display device comprising:
   a flexible panel comprising:
      a first substrate comprising a first support layer including a first organic insulation layer and a first inorganic insulation layer stacked directly thereupon, wherein a thin-film transistor and a pixel electrode are disposed on the first support layer; and
      a second substrate opposite to the first substrate, the second substrate comprising a second organic insulation layer, a second inorganic insulation layer, and a second support layer on which the second inorganic insulation layer is deposited; and
   a cover member covering an outer surface of the flexible panel,
   wherein the thin-film transistor contacts the first inorganic insulation layer.

2. The display device of claim 1, further comprising a flexible printed circuit board electrically attached at a first end portion of the first substrate that is exposed by the second substrate.

3. The display device of claim 2, wherein the cover member covers a portion of the flexible panel where the first substrate and the flexible printed circuit board make contact with each other.

4. The display device of claim 1, wherein the first support layer and the second support layer are substantially flexible.

5. The display device of claim 1, wherein the cover member is substantially flexible.

6. The display device of claim 5, wherein a thickness of the cover member is greater than or equal to about 20 μm and less than or equal to about 300 μm.

7. A display device comprising:
a flexible panel comprising:
a first substrate comprising a first support layer in which a first organic insulation layer and a first inorganic insulation layer are stacked, wherein a thin-film transistor and a pixel electrode are disposed on the first support layer; and a second substrate opposite to the first substrate, the second substrate comprising a second organic insulation layer, a second inorganic insulation layer, and a second support layer on which the second inorganic insulation layer is deposited; and
a cover member covering an outer surface of the flexible panel,
wherein the second substrate further comprises a color filter disposed on the second support layer, and a common electrode disposed on the color filter, and the color filter contacts the second inorganic insulation layer.

8. The display device of claim 1, wherein a thickness of the first or second organic insulation layer is about 3 μm to about 25 μm.

9. A method of manufacturing a display device, the method comprising:
forming a panel structure comprising a first display cell and a second display cell;
electrically attaching a flexible printed circuit board on an end portion of the panel structure; and
forming a cover member to cover an outer surface of a flexible panel in which a first carrier substrate of the first display cell and a second carrier substrate of the second display cell are separated from each other,
wherein the first display cell comprises:
the first carrier substrate;
a first attaching layer disposed on the first carrier substrate;
a first support layer disposed on the first attaching layer comprising a first organic insulation layer and a first inorganic insulation layer that are stacked on the first attaching layer and a thin-film transistor; and
a pixel electrode disposed on the first support layer, and wherein the second display cell comprises:
the second carrier substrate opposite to the display cell;
a second attaching layer disposed on the second carrier substrate; and
a second support layer disposed on the second attaching layer comprising a second organic insulation layer and a second organic insulation that are stacked thereon.

10. The method of claim 9, wherein a thickness of the first or second organic insulation layer is about 3 μm to about 25 μm.

11. The method of claim 9, wherein each of the first and second attaching layers comprises an inorganic insulator.

12. The method of claim 9, wherein each of the first and second attaching layers comprises an organic insulator.

13. The method of claim 9, wherein forming the panel structure comprises:
forming the first support layer in which the first attaching layer, the first organic insulation layer and the first inorganic insulation layer are stacked on the first carrier substrate;
forming a thin-film transistor and a pixel electrode on the first support layer;
forming the second support layer in which the second attaching layer, the second organic insulation layer and the second inorganic insulation layer are stacked on the second carrier substrate;
forming a common electrode on the second support layer;
coupling the first carrier substrate on which the pixel electrode is formed and the second carrier substrate on which the common electrode is formed; and
cutting the first and second carrier substrates to form the panel structure.

14. The method of claim 13, wherein forming the second support layer further comprises:
patterning the second support layer formed on the second carrier substrate in correspondence with the second display cell.

15. The method of claim 13, wherein in the step of forming the first support layer, the first inorganic insulation layer comprises an uppermost layer of the stack of the first organic insulation layer and the first organic insulation layer.

16. The method of claim 13, wherein in the step of forming the second support layer, the second inorganic insulation layer comprises an uppermost layer of the stack of the second organic insulation layer and the second organic insulation layer.

17. The method of claim 9, wherein forming the cover member comprises:
separating the second support layer from the second attaching layer of the second display cell to form a second substrate;
forming a first cover layer using a resin material to cover an outer surface of the second substrate;
separating the first support layer from the first attaching layer of the first display cell to form a first substrate; and
forming a second cover layer using the resin to cover an outer surface of the first substrate.

18. The method of claim 17, wherein the second cover layer covers an end portion of the first substrate electrically connected to an end portion of the flexible printed circuit board.

19. The method of claim 17, wherein each of the first and second cover layers has a thickness of about 20 μm to about 300 μm.

20. The method of claim 17, wherein the resin material comprises an optically transparent low temperature curing resin.

21. The method of claim 17, wherein the resin material comprises at least one of a polyimide (PI) resin, a polyethersulfone (PES) resin, a polyethyleneterephthalate (PET) resin, a polyarylate (PAR) resin, or an acrylite resin.

22. The method of claim 17, wherein each of the first and second support layers is separated from the first attaching layers using a laser light.

23. The display device of claim 7, further comprising a flexible printed circuit board electrically attached at a first end portion of the first substrate that is exposed by the second substrate.

24. The display device of claim 23, wherein the cover member covers a portion of the flexible panel where the first substrate and the flexible printed circuit board make contact with each other.

25. The display device of claim 7, wherein the first support layer and the second support layer are substantially flexible.

26. The display device of claim 1, wherein the cover member is substantially flexible.

27. The display device of claim 26, wherein a thickness of the cover member is greater than or equal to about 20 μm and less than or equal to about 300 μm.

28. The display device of claim 7, wherein a thickness of the first or second organic insulation layer is about 3 μm to about 25 μm.

* * * * *